United States Patent
Sato

(10) Patent No.: US 6,944,073 B2
(45) Date of Patent: Sep. 13, 2005

(54) SEMICONDUCTOR INTEGRATED CIRCUIT DEVICE

(75) Inventor: Kazuo Sato, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 65 days.

(21) Appl. No.: 10/724,364

(22) Filed: Dec. 1, 2003

(65) Prior Publication Data

US 2004/0125674 A1 Jul. 1, 2004

(30) Foreign Application Priority Data

Dec. 2, 2002 (JP) .................................. 2002-349987

(51) Int. Cl.[7] .................................................. G11C 7/00
(52) U.S. Cl. ...................... 365/200; 365/219; 365/221
(58) Field of Search ................................. 365/200, 219, 365/221, 201

(56) References Cited

U.S. PATENT DOCUMENTS 6,400,617 B1 * 6/2002 Aikawa et al. ............. 365/200

FOREIGN PATENT DOCUMENTS

JP 10-144862 5/1998

* cited by examiner

Primary Examiner—David Lam
(74) Attorney, Agent, or Firm—Arent Fox, PLLC.

(57) ABSTRACT

A conventional semiconductor integrated circuit device suffers from the increasing difficulty in definitely setting the output state of a redundancy circuit as the number of conductor layers increases. To overcome this inconvenience, according to the present invention, a semiconductor integrated circuit device has a first semiconductor chip having a nonvolatile memory for storing redundancy information, and has a second semiconductor chip having a conversion circuit for converting the redundancy information output in the form of serial data from the nonvolatile memory into parallel data and a redundancy circuit of which the output state is definitely set by receiving the parallel data output from the conversion circuit.

8 Claims, 5 Drawing Sheets

SEMICONDUCTOR INTEGRATED CIRCUIT DEVICE

This application is based on Japanese Patent Application No. 2002-349987 filed on Dec. 2, 2002, the contents of which are hereby incorporated by reference.

BACKGROUND OF THE INVENTION

1. Field of the Invention

The present invention relates to a semiconductor integrated circuit device, and more particularly to a semiconductor integrated circuit device provided with a redundancy circuit.

2. Description of the Prior Art

A semiconductor integrated circuit such as a memory usually incorporates a redundancy circuit by the use of which an effective circuit block is selected. This helps increase the yield of the product. FIG. 4 shows an example of the configuration of a conventional redundancy circuit. The redundancy circuit shown in FIG. 4 is composed of N+1 address program circuits AP0 to APN and an AND circuit 14 that outputs, as a signal REDEN, the AND of the outputs of the individual address program circuits AP0 to APN. Each address program circuit is composed of a MOSFET (metal-oxide semiconductor field-effect transistor), a fuse element, and a judgment circuit.

Here, the configuration of the address program circuit AP0 will be described. An n-channel MOSFET 11 receives a constant voltage Vcc at its source, receives a gate signal NEN at its gate, and has its drain grounded through a fuse element 12. The node between the MOSFET 11 and the fuse element 12 is connected to a judgment circuit 13. The judgment circuit 13 receives an input signal A(0), and outputs an output signal PROG(0) according to the potential at the node between the MOSFET 11 and the fuse element 12. The other address program circuits AP1 to APN are configured in the same manner as the address program circuit AP0, and therefore their configuration will not be discussed separately.

The fuse elements provided in the address program circuits AP0 to APN are typically "polyfuses", i.e., fuse elements formed of polycrystalline silicon. FIG. 5 is a schematic sectional view of and around a polyfuse formed in a redundancy circuit. The polyfuse 16 is formed above a LOCOS (local oxidation of silicon) 15, and is covered with a protective film (passivation) 17 from above. Moreover, a window 18 is formed to permit the polyfuse 16 to be cut easily with a laser beam. Furthermore, multilayer conductors 19 are formed in the protective film 17.

Which polyfuses 16 to cut is determined according to where a semiconductor integrated circuit has defects, and cutting the relevant polyfuses with a laser beam definitely set the output state of a redundancy circuit as shown in FIG. 4.

However, in semiconductor integrated circuits, in particular in modern high-performance semiconductor integrated circuits, conductors tend to be laid in increasing numbers of layers. This trend has inevitably been increasing the thickness h of the protective film 17 (see FIG. 5), and thus has been making it increasingly difficult to cut the polyfuses 16 with a laser beam unless the windows are made accordingly large. As the number of conductor layers further increases in future, the windows need to be made increasingly small according to design rules, until eventually it becomes impossible to cut the polyfuses with existing laser equipment.

Some redundancy circuits use, as fuse elements, metal fuses instead of polyfuses. In a redundancy circuit so configured, the metal fuses can be formed near the surface layer (top) of the protective film, and therefore, even as the number of conductor layers further increases and the thickness of the protective film increases, it does not become difficult to cut them with a laser beam. However, as compared with polyfuses, metal fuses are liable to cutting failure resulting from refusing or the like after cutting with a laser beam. This necessitates larger cutting windows than for polyfuses.

Incidentally, Japanese Patent Registered No. 2845847 discloses a semiconductor integrated circuit incorporating a custom-made circuit portion that are so configured as to meet a user's requirements. However, this patent makes no mention of redundancy circuits or multilayer conductors.

SUMMARY OF THE INVENTION

An object of the present invention is to provide a semiconductor integrated circuit device that permits the output state of a redundancy circuit to be definitely set easily even with an increased number of conductor layers.

To achieve the above object, a semiconductor integrated circuit device according to the present invention is provided with a first semiconductor chip having a nonvolatile memory for storing redundancy information, and a second semiconductor chip having a conversion circuit for converting the redundancy information output in the form of serial data from the nonvolatile memory into parallel data and a redundancy circuit of which the output state is definitely set by receiving the parallel data output from the conversion circuit.

According to the present invention, a semiconductor integrated circuit device is provided with a first semiconductor chip having a nonvolatile memory for storing redundancy information, and a second semiconductor chip having a conversion circuit for converting the redundancy information output in the form of serial data from the nonvolatile memory into parallel data and a redundancy circuit of which the output state is definitely set by receiving the parallel data output from the conversion circuit. This makes it possible to definitely set the output state of the redundancy circuit without a laser beam. In this way, it is possible to realize a semiconductor integrated circuit device that permits the output state of a redundancy circuit to be definitely set easily even with an increased number of conductor layers. Moreover, there is no need to use laser equipment any longer. This helps simplify the manufacturing facilities.

Moreover, according to the present invention, data transfer from the nonvolatile memory to the conversion circuit is achieved in the form of serial data. This helps reduce the number of connectors (for example, bumps) by way of which the nonvolatile memory and the conversion circuit are connected together. This helps reduce the size and cost of the semiconductor integrated circuit device as compared with in a case where data transfer from the nonvolatile memory to the conversion circuit is achieved in the form of parallel data.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
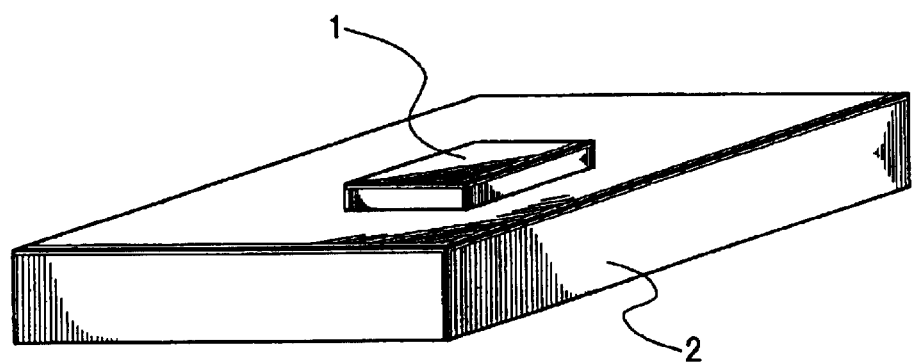
FIG. 1 is a diagram showing the outer appearance of a semiconductor integrated circuit device according to the invention.

FIG. 1 is an external view of a semiconductor integrated circuit device according to the present invention. A first semiconductor chip 1 and a second semiconductor chip 2 are connected together by way of bumps (not illustrated). The second semiconductor chip 2 has a memory IC, a memory circuit, and a CPU circuit previously incorporated in it to form a semiconductor integrated circuit (not illustrated) generally called an embedded IC.

Figure 2:
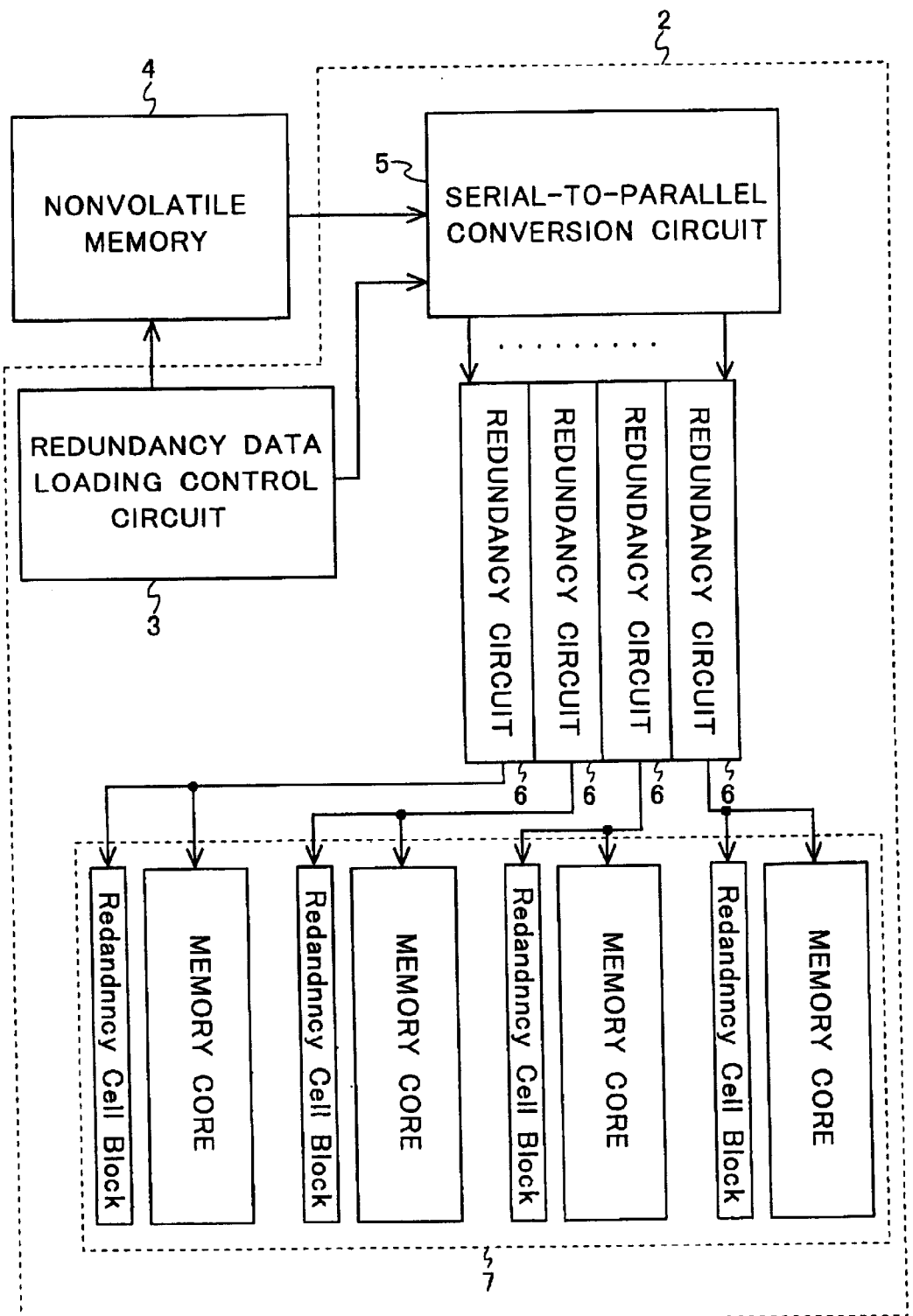
FIG. 2 is a circuit block diagram of a principal portion of the semiconductor integrated circuit device according to the invention.

FIG. 2 is a circuit block diagram of a principal portion of the semiconductor integrated circuit device according to the invention. The semiconductor integrated circuit device according to the invention has a redundancy data loading control circuit 3, a nonvolatile memory 4, a serial-to-parallel conversion circuit 5, a plurality of redundancy circuits 6, and a plurality of functional circuits 7, such as memories, having circuits that are individually selected or unselected by the redundancy circuits 6. The nonvolatile memory 4, such as a flash memory or EEPROM (electrically-erasable programmable read-only memory), is provided on the first semiconductor chip 1 (see FIG. 1), and the redundancy data loading control circuit 3, the serial-to-parallel conversion circuit 5, the redundancy circuits 6, and the functional circuits 7 are provided on the second semiconductor chip 2 (see FIG. 1). The nonvolatile memory 4 is provided with connection terminals for connection to the redundancy data loading control circuit 3, and these connection terminals are connected, by way of bumps (not illustrated), to the connection terminals provided in the redundancy data loading control circuit 3. The nonvolatile memory 4 is also provided with connection terminals for connection to the serial-to-parallel conversion circuit 5, and these connection terminals are connected, by way of bumps (not illustrated), to the connection terminals provided in the serial-to-parallel conversion circuit 5.

Redundancy information, i.e., information on the defects found in the functional circuits 7 provided on the second semiconductor chip 2, is previously stored in the nonvolatile memory 4. When electric power is supplied to the semiconductor integrated circuit device according to the invention, the redundancy data loading control circuit 3 feeds the nonvolatile memory 4 with operation commands, and controls the operation of the serial-to-parallel conversion circuit 5. According to the operation commands fed from the redundancy data loading control circuit 3 by serial control, the nonvolatile memory 4 starts serial transfer of the previously stored redundancy information. Under the control of the redundancy data loading control circuit 3, the serial-to-parallel conversion circuit 5 converts the serial data transferred from the nonvolatile memory 4 into parallel data, and feeds it to the individual redundancy circuits 6. When the redundancy circuits 6 receive this parallel data, their output states are definitely set, with the result that, according to the thus definitely set data, some of the functional circuits 7 are selected and the others unselected.

Here, the data transfer from the nonvolatile memory 4 provided on the first semiconductor chip 1 to the serial-to-parallel conversion circuit 5 provided on the second semiconductor chip 2 and the data transfer from the second semiconductor chip 2 to the first semiconductor chip 1 is achieved with serial data. This helps reduce the number of bumps by way of which the first and second semiconductor chips 1 and 2 are connected together. In general, as the number of bumps increases, the area of the pads required for them also increases. Accordingly, by reducing the number of bumps, it is possible to make the semiconductor integrated circuit device smaller.

Figure 3:
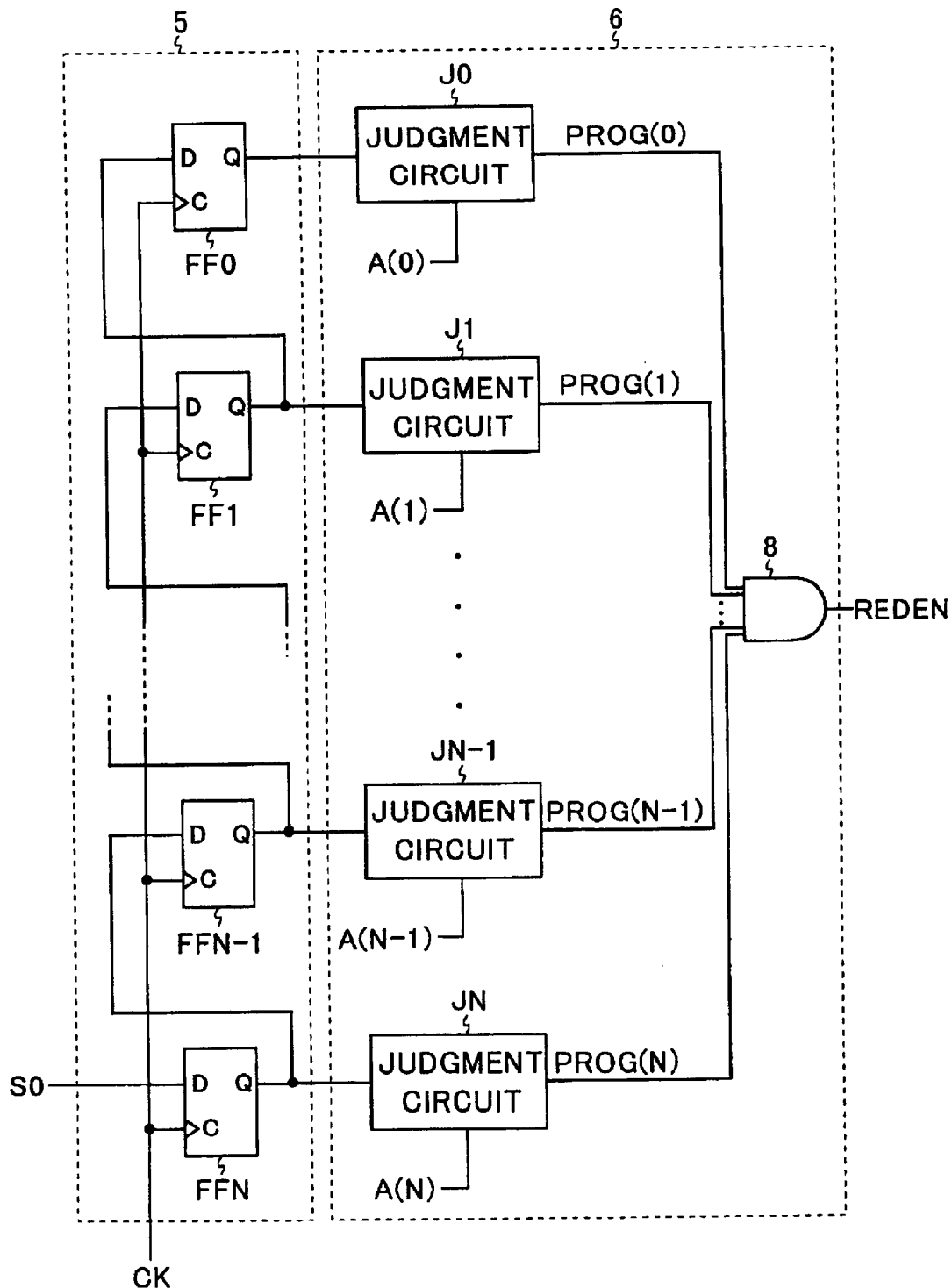
FIG. 3 is a diagram showing an example of the circuit configuration of the serial-to-parallel conversion circuit and redundancy circuit provided in the semiconductor integrated circuit device according to the invention.
Figure 4:
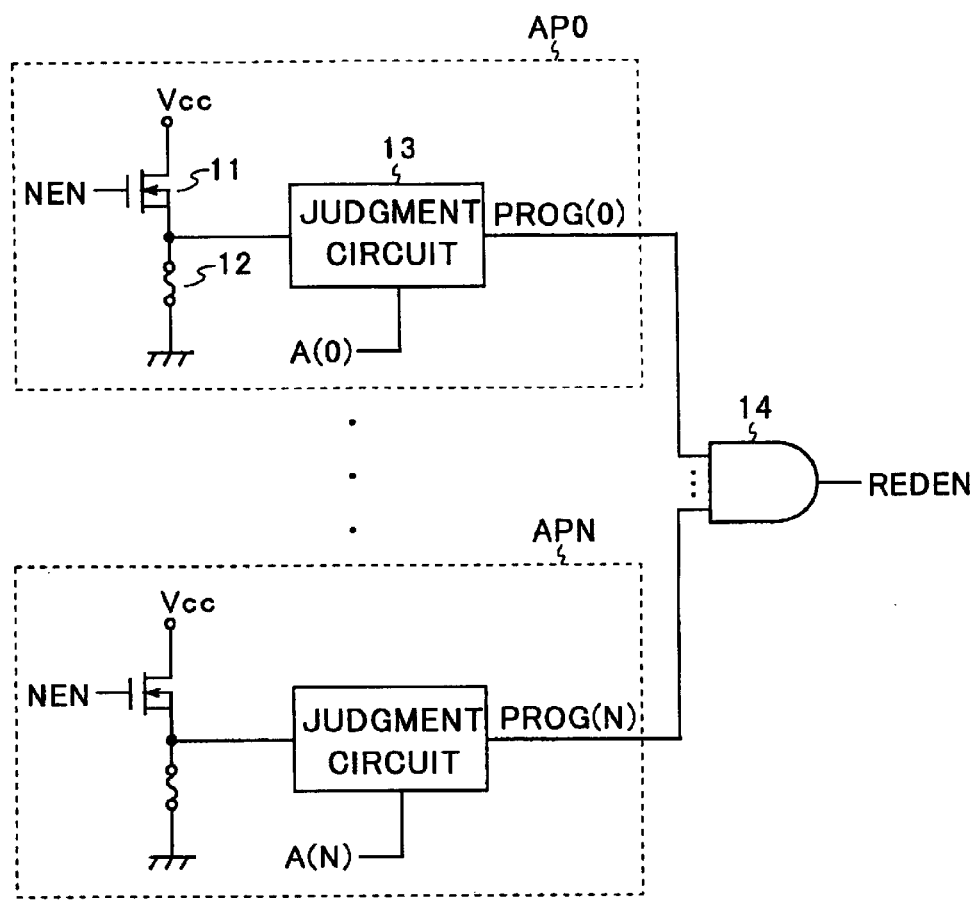
FIG. 4 is a diagram showing an example of an outline of the configuration of the redundancy circuit provided in a conventional semiconductor integrated circuit device.
Figure 5:
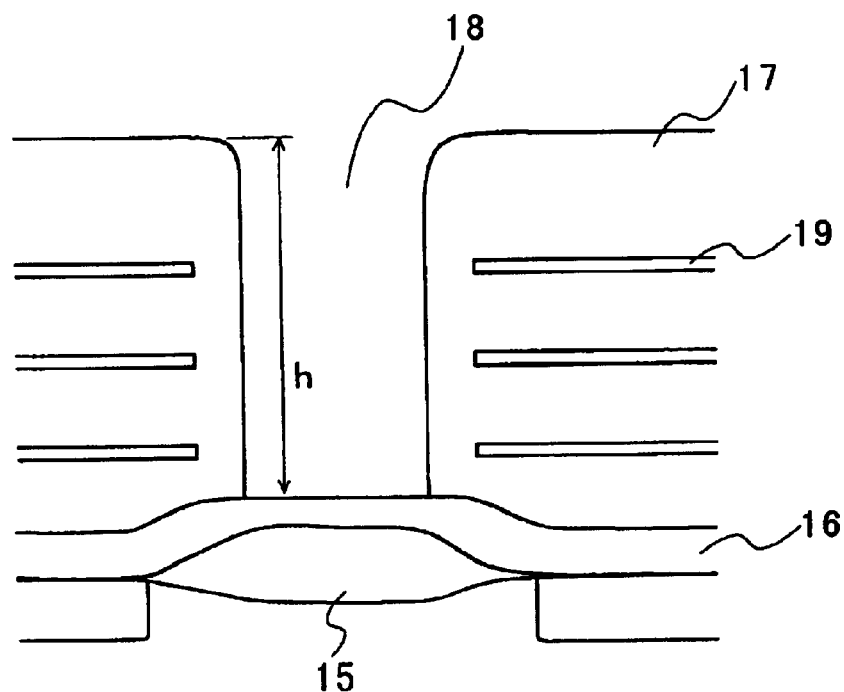
FIG. 5 is a sectional view of and around a polyfuse provided in the redundancy circuit shown in FIG. 4.

Next, the circuit configuration of the serial-to-parallel conversion circuit 5 and the redundancy circuits 6 will be described. FIG. 3 shows an example of the circuit configuration of the serial-to-parallel conversion circuit 5 and the redundancy circuits 6. In FIG. 3, such signals as are found also in FIG. 4 are identified with the same reference symbols. Moreover, in FIG. 3, such circuit elements as are found also in FIG. 2 are identified with the same reference numerals.

The serial-to-parallel conversion circuit 5 is composed of N+1 flip-flops FF0 to FFN. The flip-flops FF0 to FFN receive a clock signal CK at their clock terminals (C terminals). The clock signal CK is output from the redundancy data loading control circuit 3 (see FIG. 2). The data input terminal (D terminal) of the flip-flop FF0 is connected to the non-inverting output terminal (Q terminal) of the flip-flop FF1 and to a judgment circuit J1. Likewise, the data input terminal (D terminal) of the flip-flop FFk is connected to the non-inverting output terminal (Q terminal) of the flip-flop FFk+1 and to a judgment circuit Jk+1 (where k is a natural number in the range from 1 to N−1). The non-inverting output terminal (Q terminal) of the flip-flop FF0 is connected to a judgment circuit J0, and the flip-flop FFN receives serial data S0 at its data input terminal (D terminal). The serial data S0 fed to the data input terminal (D terminal) of the flip-flop FFN is the serial data of redundancy information output from the nonvolatile memory 4 (see FIG. 2).

The judgment circuit Jm receives an input signal A(m) and outputs an output signal PROG(m) according to the output of the flip-flop FFm (where m is an integer number in the range from 0 to N). An AND circuit 8 receives the outputs of the individual judgment circuits J0 to JN, and outputs, as a signal REDEN, the AND of the outputs of the judgment circuits J0 to JN. Thereafter, the semiconductor integrated circuit device performs normal operation.

By configuring the serial-to-parallel conversion circuit 5 and the redundancy circuits 6 as described above, it is possible to output the same signal REDEN as is output from the conventional redundancy circuit shown in FIG. 4.

In the manufacturing process of the semiconductor integrated circuit according to the present invention, defects in the embedded circuits provided on the second semiconductor chip are detected through inspection using a tester or the like, and, on the basis of the results of the detection, redundancy information is created. The redundancy information is then stored in the nonvolatile memory 4. Thereafter, with the nonvolatile memory, thus having the redundancy information stored therein, connected to the serial-to-parallel conversion circuit, inspection is performed by using a tester or the like to check whether or not the defects have been eliminated as expected. By contrast, in the manufacturing process of a semiconductor integrated circuit incorporating the conventional redundancy circuits shown in FIG. 4, defects in the semiconductor integrated circuit are detected by the use of electrical signals, and, on the basis of the results of the detection, redundancy information is created. Then, according to the redundancy information, fuse elements are cut with a laser beam. Thereafter, inspection is performed by using electrical signals or the like to check whether or not the defects have been eliminated as expected. In the manufacturing process of the semiconductor integrated circuit device according to the present invention, an extra step of connecting bumps together is required, but there is no need to use laser equipment to cut a large number of fuse elements or to form deep holes as windows as practiced in the manufacturing process of conventional semiconductor integrated circuits. This helps simplify the manufacturing facilities.

What is claimed is:

1. A semiconductor integrated circuit device comprising:
   a first semiconductor chip having a nonvolatile memory for storing redundancy information; and
   a second semiconductor chip having a conversion circuit for converting the redundancy information output in a form of serial data from the nonvolatile memory into parallel data and a redundancy circuit of which an output state is definitely set by receiving the parallel data output from the conversion circuit.

2. A semiconductor integrated circuit device as claimed in claim 1,
   wherein the nonvolatile memory and the conversion circuit are connected together by way of a bump.

3. A semiconductor integrated circuit device as claimed in claim 2,
   wherein the second semiconductor chip has conductors laid in multiple layers.

4. A semiconductor integrated circuit device as claimed in claim 1,
   wherein the second semiconductor chip further has a redundancy data loading control circuit that feeds the nonvolatile memory with operation commands and that controls operation of the conversion circuit.

5. A semiconductor integrated circuit device as claimed in claim 4,
   wherein the nonvolatile memory and the conversion circuit are connected together by way of a bump, and
   the nonvolatile memory and the redundancy data loading control circuit are connected together by way of a bump.

6. A semiconductor integrated circuit device as claimed in claim 5,
   wherein the second semiconductor chip has conductors laid in multiple layers.

7. A semiconductor integrated circuit device as claimed in claim 4,
   wherein the second semiconductor chip has conductors laid in multiple layers.

8. A semiconductor integrated circuit device as claimed in claim 1,
   wherein the second semiconductor chip has conductors laid in multiple layers.

\* \* \* \* \*